(12) United States Patent
Hicks et al.

(10) Patent No.: US 7,202,672 B2
(45) Date of Patent: Apr. 10, 2007

(54) PARTIAL DISCHARGE SENSOR

(75) Inventors: Clarence A. Hicks, Avondale, AZ (US); Wallace Vahlstrom, San Ramon, CA (US)

(73) Assignee: Electrical Reliability Services, Inc., San Ramon, CA (US)

( * ) Notice: Subject to any disclaimer, the term of this patent is extended or adjusted under 35 U.S.C. 154(b) by 0 days.

(21) Appl. No.: 11/217,096

(22) Filed: Aug. 31, 2005

(65) Prior Publication Data
US 2007/0046296 A1    Mar. 1, 2007

(51) Int. Cl.
*G01R 31/12*    (2006.01)
(52) U.S. Cl. .................... 324/536; 324/551; 324/72.5
(58) Field of Classification Search ............ 324/117 H, 324/117 R
See application file for complete search history.

(56) References Cited

U.S. PATENT DOCUMENTS

| | | | |
|---|---|---|---|
| 5,656,931 A | | 8/1997 | Lau et al. |
| 6,586,923 B2 * | | 7/2003 | Seike ...................... 324/117 H |
| 2002/0073853 A1 * | | 6/2002 | Norcross ...................... 99/342 |
| 2003/0151412 A1 * | | 8/2003 | Gregory et al. ............. 324/536 |
| 2004/0046568 A1 * | | 3/2004 | Unsworth et al. .......... 324/536 |

* cited by examiner

*Primary Examiner*—Vincent Q. Nguyen
(74) *Attorney, Agent, or Firm*—Kinney & Lange, P.A.

(57) ABSTRACT

A RF current transformer sensor includes a first sensor portion and a second sensor portion. The first and second sensor portions are configured to define a fixed opening for receiving a test object. The RF current transformer sensor is capable of detecting current pulses between the first sensor portion and the second sensor portion for sensing partial discharges from the test object. Further disclosed is a method of partial discharge sensing.

16 Claims, 4 Drawing Sheets

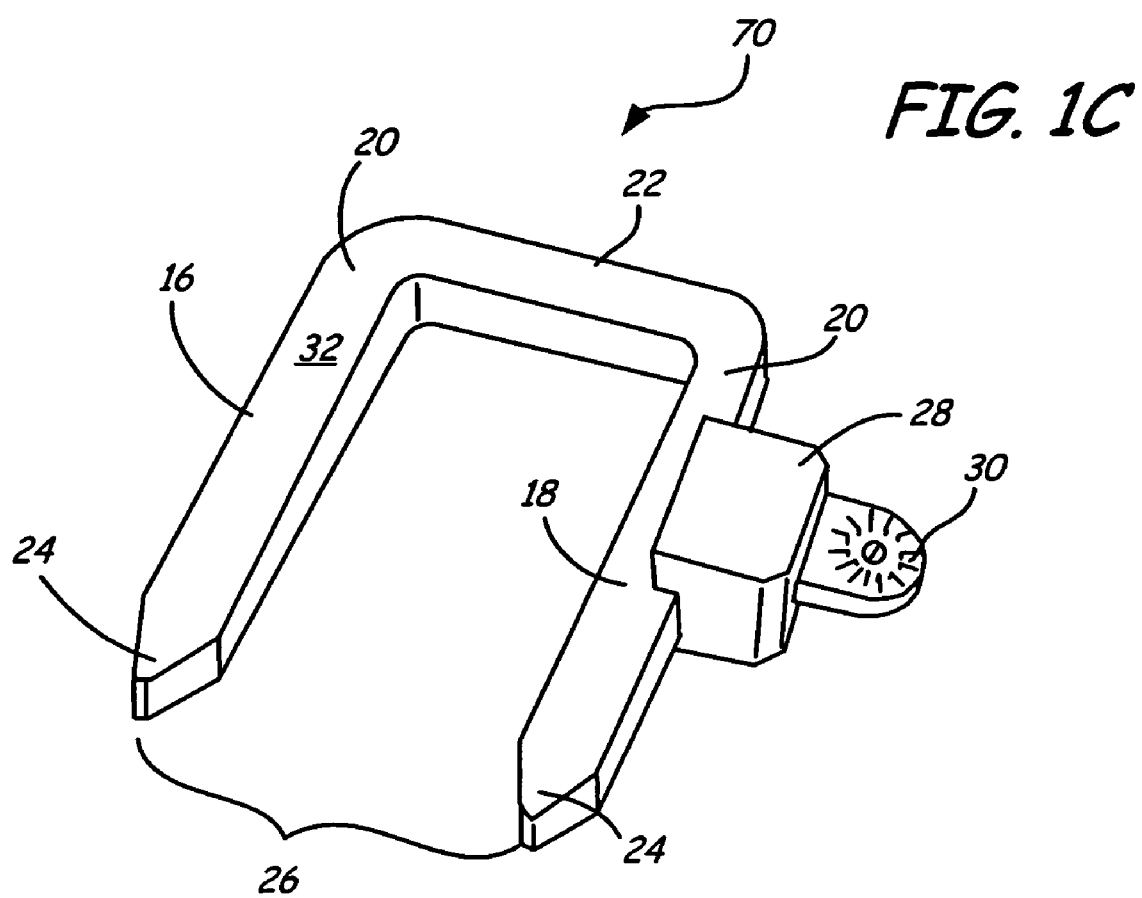

PARTIAL DISCHARGE SENSOR

BACKGROUND OF THE INVENTION

The present invention relates to sensors for partial discharge sensing. In particular, the invention relates to RF current transformer sensors used for detecting partial discharges in power cables.

Partial discharge sensing can be used to assess the condition of power cables. More particularly, partial discharge sensing can be used to detect deterioration of insulation of power cables by detecting high frequency currents that are created by small gaps, voids or other deterioration in power cable insulation.

Typically, a partial discharge sensing system includes a partial discharge sensor, a spectrum analyzer, and a signal cable for carrying electrical signals between the sensor and the spectrum analyzer. In order to conduct an online partial discharge test, an operator secures the sensor at a test location on a "live" power cable (i.e., one with electrical current flowing through it). Then, the operator manually conducts a partial discharge test using the spectrum analyzer.

Some partial discharge sensors are split core RF current transformer sensors. These sensors are clam-shaped and hinged, with a generally circular central opening formed when the sensor is in a closed position. In use, these sensors are closed around the power cable to be tested in order to conduct tests. Operators must touch these split core sensors in order to secure them to the power cable. With online testing, the power cable is energized or "live". Therefore, the operator's hands must come in close proximity to the "live" power cable in order to secure the split core sensor to it. This presents a safety hazard to operators, who risk electrical shock, electrocution, and other serious injury, as the power cables can carry current at a high voltage (e.g., 15,000 volts).

BRIEF SUMMARY OF THE INVENTION

A RF current transformer sensor according to the present invention includes a first sensor portion and a second sensor portion. The first and second sensor portions are configured to define a fixed opening for receiving a test object. The RF current transformer sensor is capable of detecting current pulses between the first sensor portion and the second sensor portion for sensing partial discharges from the test object. The present invention also includes a method of partial discharge sensing.

BRIEF DESCRIPTION OF THE DRAWINGS

FIG. 1C is a perspective view of a RF current transformer sensor having a "C" shape.

DETAILED DESCRIPTION

Figure 1A:
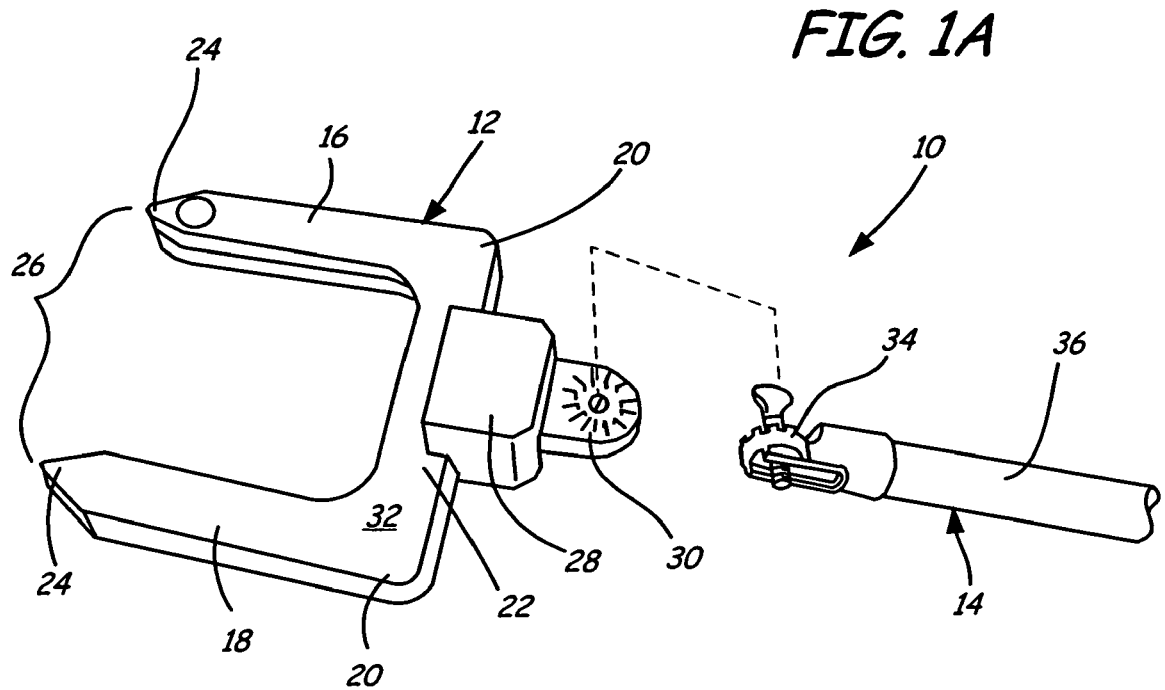
FIG. 1A is an exploded perspective view of a RF current transformer sensor system according to the present invention.

FIG. 1A is an exploded perspective view of a portable RF current transformer sensor system 10 that includes a RF current transformer sensor 12 and a universal hot stick 14. The sensor 12 has a first sensor portion 16 and a second sensor portion 18. The first and second sensor portions 16 and 18 are arranged in a substantially parallel configuration. Each of the first and second sensor portions 16 and 18 has a first end 20 that is connected to a base portion 22 of the sensor 12 and an opposite second end 24. The second ends 24 of the first and second sensor portions 16 and 18 can be tapered to facilitate positioning the sensor 12. A fixed opening 26 is defined between the first and second sensor portions 16 and 18, and the opening 26 extends from the second ends 24 of the first and second sensor portions 16 and 18 to the base portion 22 of the sensor 12. A connector port (not shown) for connecting a RF signal cable to the sensor 12 is provided on the base portion 22.

A support protrusion 28 extends from the base portion 22 of the sensor 12. A universal hot stick mount 30 is provided on the support protrusion 28 for mounting the sensor 12 on the hot stick 14 (or a similar support device).

As shown in FIG. 1A, the sensor 12 is generally U-shaped. The sensor 12 includes internal windings that function as the secondary winding of the transformer (the power cable to be tested functions as the primary winding of the transformer). The internal windings of the sensor 12 can be roughly equally divided between the first and second sensor portions 16 and 18. In one embodiment, the sensor 12 has a frequency detection range of about 100 kHz to about 400 MHz or to at least about 200 MHz. In a preferred embodiment, the sensor 12 has a frequency detection range of about 2 MHz to about 60 MHz, which has been found to be a suitable range for online partial discharge testing. Sensors of such desired characteristics are available from Fischer Custom Communications, Inc., Torrance, Calif.

In one embodiment, an outer surface 32 of the sensor 12 can comprise a metallic material. In an alternative embodiment, the outer surface of the sensor 12 can comprise a polymer material, such as polytetrafluoroethylene (PTFE).

The universal hot stick 14 includes a universal mount 34 (which includes a threaded fastener) for cooperative engagement with the hot stick mount 30 on the sensor 12. The respective mounts 30 and 34 permit the sensor 12 to be secured to the hot stick 14 at a desired orientation. The universal mount 34 is secured to a rigid insulative handle 36 of a desired length, for permitting a technician to position the attached sensor 12 from a distance.

Figure 1B:
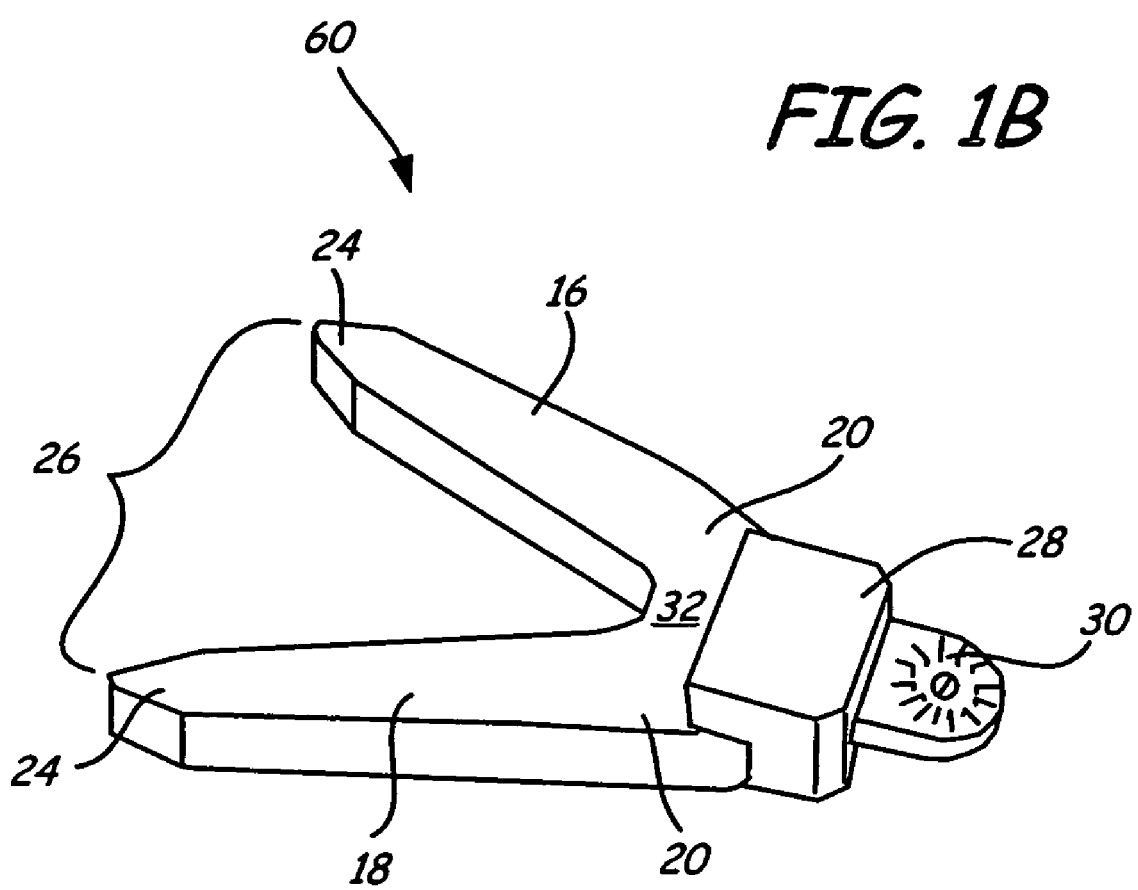
FIG. 1B is a perspective view of a RF current transformer sensor having a "V" or "Y" shape.

In further embodiments, the sensor can have other shapes. FIG. 1B is a perspective view of a RF current transformer sensor 60 having a "V" or "Y" shape. FIG. 1C is a perspective view of a RF current transformer sensor 70 having a "C" shape. Sensors 60 and 70 are generally similar to sensor 12, as shown and described with respect to FIG. 1A, with modified shapes.

Figure 2:
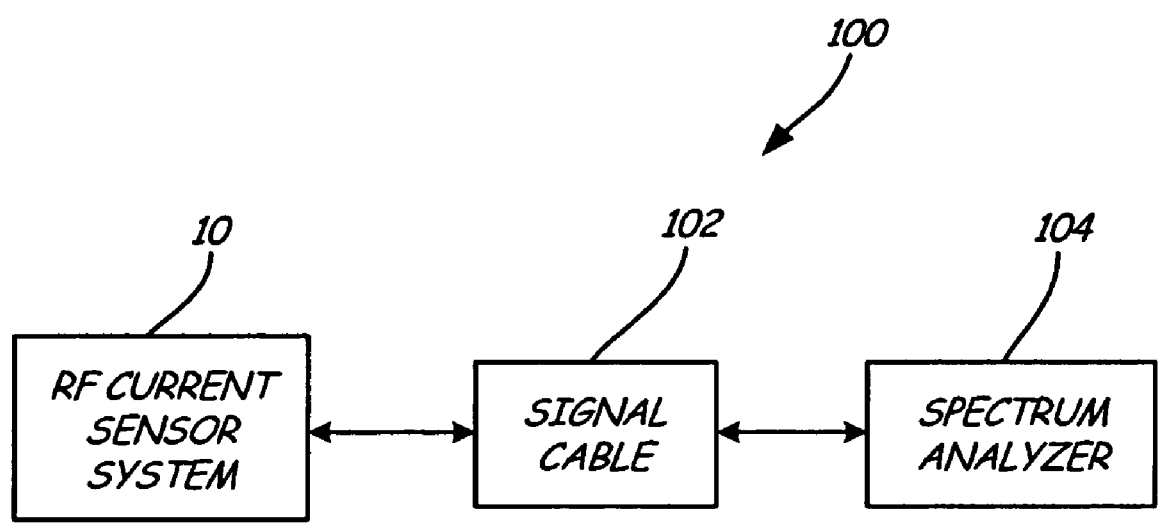
FIG. 2 is a block diagram of a partial discharge sensing system utilizing the RF current transformer system of FIG. A.

FIG. 2 is a block diagram of a partial discharge sensing system 100 utilizing the RF current transformer system 10 described above. The sensing system 100 includes a signal cable 102 and a spectrum analyzer 104. The signal cable 102 can be a conventional RF coaxial cable, and can be connected between the spectrum analyzer 104 and the sensor system 10 in any suitable manner, as will be appreciated by those skilled in the art. Moreover, it should be recognized that additional components, such as preamplifier, can be included with system 100, that are not shown in FIG. 2.

In operation, the partial discharge sensing system 100 permits online testing of energized insulated cables (i.e., power cables carrying a "live" voltage) or other similar energized objects. A portion of a cable to be tested can be positioned in the opening 26 of the sensor 12 (or the sensor 60) by moving the sensor 12 with the attached hot stick 14, such that the cable to be tested contacts the sensor 12 at two or more points. An operator can position the sensor 12 while keeping his or her body and appendages spaced from the sensor 12 and, in addition, spaced from the energized cable to be tested. Online partial discharge testing, to sense any surface currents that may be present on the cable to be tested due to cracks in its insulation, can then be conducted with the spectrum analyzer 104 according to known analysis procedures (e.g., using frequency domain test procedures). Then, the sensor 12 can be moved away from the tested cable by moving the hot stick 14. In that way, the operator can position the sensor 12, conduct test routines, and move the sensor 12 away from the test location without having to ever place his or her hands near the sensor 12 or the energized cables to be tested. This reduces the risk of harm to the operator due to electrocution and shock.

Although the present invention has been described with reference to preferred embodiments, workers skilled in the art will recognize that changes may be made in form and detail without departing from the spirit and scope of the invention. For instance, the manner of connecting a sensor according to the present invention to a suitable spectrum analyzer can include any means of transmitting signals therebetween.

The invention claimed is:

1. A RF current transformer sensor for conducting partial discharge testing on a test object, the sensor comprising:
   a first sensor portion having a generally elongate shape and defining a distal end; and
   a second sensor portion having a generally elongate shape and defining a distal end, wherein the first and second sensor portions are configured to define a fixed opening for receiving a portion of the test object, wherein the distal ends of the first and second sensor portions are located at a substantially widest dimension of the fixed opening, and wherein the RF current transformer sensor is capable of detecting current pulses between the first sensor portion and the second sensor portion for sensing partial discharges from the test object.

2. The sensor of claim 1, wherein the first and second sensor portions are configured substantially in a shape selected from the group consisting of: U-shaped, V-shaped and C-shaped.

3. The sensor of claim 1, wherein the first and second sensor portions each have an outer surface, and wherein the outer surface is formed of a polymer material.

4. The sensor of claim 1, wherein the sensor has a frequency detection range of about 2 MHz to about 60 MHz.

5. The sensor of claim 1 and further comprising:
   a sensor base portion, wherein the first sensor portion and the second sensor portion extend from the sensor base portion.

6. The sensor of claim 5, wherein the first sensor portion extends from the sensor base portion at approximately a right angle, and wherein the second sensor portion extends from the sensor base portion at approximately a right angle.

7. The sensor of claim 5 and further comprising:
   a support protrusion extending from the sensor base portion in a direction generally opposite the first sensor portion and the second sensor portion.

8. The sensor of claim 5 and further comprising:
   a support protrusion extending from the second sensor portion.

9. The sensor of claim 1, wherein the first sensor portion and the second sensor portion are arranged substantially parallel to each other.

10. The sensor of claim 1 and further comprising:
    a support protrusion for supporting the first sensor portion and the second sensor portion.

11. The sensor of claim 1 and further comprising:
    a mount structure for connecting the sensor to an insulated handle.

12. The sensor of claim 1, wherein the first sensor portion and the second sensor portion meet to define an apex.

13. The sensor of claim 12 and further comprising:
    a support protrusion located at the apex where the first sensor portion and the second sensor portion meet.

14. A RF current transformer sensor for conducting partial discharge testing on a test object, the sensor comprising:
    a first sensor portion having a generally elongate shape and defining a distal end;
    a second sensor portion having a generally elongate shape and defining a distal end, wherein the first and second sensor portions are configured to define a fixed opening for receiving a portion of the test object, wherein the distal ends of the first and second sensor portions are located at a substantially widest dimension of the fixed opening, and wherein the RF current transformer sensor is capable of detecting current pulses between the first sensor portion and the second sensor portion for sensing partial discharges from the test object; and
    a support protrusion extending from the first sensor portion.

15. A RF current transformer sensor for conducting partial discharge testing on a test object. the sensor comprising:
    a first sensor portion having a generally elongate shape and defining a distal end;
    a second sensor portion having a generally elongate shape and defining a distal end, wherein the first sensor portion and the second sensor portion meet to define an apex, wherein the first and second sensor portions are configured to define a fixed opening for receiving a portion of the test object, wherein the distal ends of the first and second sensor portions are located at a substantially widest dimension of the fixed opening, and wherein the RF current transformer sensor is capable of detecting current pulses between the first sensor portion and the second sensor portion for sensing partial discharges from the test object; and
    a support protrusion extending from the apex where the first sensor portion and the second sensor portion meet.

16. A RF current transformer sensor for conducting partial discharge testing on a test object, the sensor comprising:
    a first sensor portion having a generally elongate shape and defining a distal end;
    a second sensor portion having a generally elongate shape and defining a distal end, wherein the first and second sensor portions are configured to define a fixed opening for receiving a portion of the test object, wherein the distal ends of the first and second sensor portions are located at a substantially widest dimension of the fixed opening, and wherein the RF current transformer sensor is capable of detecting current pulses between the first sensor portion and the second sensor portion for sensing partial discharges from the test object;
    a base portion, wherein the first sensor portion and the second sensor portion both extend from the base portion; and
    a support protrusion extending from the base portion.

* * * * *

UNITED STATES PATENT AND TRADEMARK OFFICE
CERTIFICATE OF CORRECTION

PATENT NO. : 7,202,672 B2
APPLICATION NO. : 11/217096
DATED : April 10, 2007
INVENTOR(S) : Clarence A. Hicks et al.

It is certified that error appears in the above-identified patent and that said Letters Patent is hereby corrected as shown below:

Title Page, Line (75) Inventors, delete "Wallace Vahlstrom, San Ramon, CA" insert --Wallace Vahlstrom, Pleasanton, CA--

Signed and Sealed this

Nineteenth Day of June, 2007

JON W. DUDAS
*Director of the United States Patent and Trademark Office*